United States Patent
Li et al.

(10) Patent No.: US 11,757,056 B2
(45) Date of Patent: Sep. 12, 2023

(54) OPTICAL SENSOR AND THIN FILM PHOTODIODE

(71) Applicants: IMEC vzw, Leuven (BE); Katholieke Universiteit Leuven, Leuven (BE)

(72) Inventors: Yunlong Li, Heverlee (BE); Epimitheas Georgitzikis, Saint-Gilles (BE); David Cheyns, Heffen (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 219 days.

(21) Appl. No.: 17/081,829

(22) Filed: Oct. 27, 2020

(65) Prior Publication Data

US 2021/0134886 A1 May 6, 2021

(30) Foreign Application Priority Data

Oct. 31, 2019 (EP) .................... 19206657

(51) Int. Cl.
*H01L 31/0392* (2006.01)
*H01L 27/146* (2006.01)
*H01L 31/0232* (2014.01)
*H01L 31/0224* (2006.01)

(52) U.S. Cl.
CPC .... *H01L 31/0392* (2013.01); *H01L 27/14634* (2013.01); *H01L 31/02327* (2013.01); *H01L 31/022408* (2013.01)

(58) Field of Classification Search
CPC ......... H01L 27/14634; H01L 27/14636; H01L 27/1464; H01L 31/022408; H01L 31/02327
See application file for complete search history.

(56) References Cited

U.S. PATENT DOCUMENTS

| 5,317,235 A | 5/1994 | Treglio |
| 7,498,257 B2 | 3/2009 | Chiu et al. |
| 2010/0307557 A1 | 12/2010 | Yamazaki et al. |
| 2012/0298846 A1* | 11/2012 | Nomura ............... C07D 219/14 257/E51.012 |

(Continued)

OTHER PUBLICATIONS

D.A. Karpov "Cathodic arc sources and macroparticle filtering," *Surface and Coatings Technology*, vol. 96, pp. 22-33, 1997.

(Continued)

*Primary Examiner* — Daniel P Shook
(74) *Attorney, Agent, or Firm* — Knobbe, Martens, Olson & Bear, LLP

(57) ABSTRACT

An aspect comprising an optical sensor is disclosed. The optical sensor comprises stacked layers comprising: a window layer configured to allow the passage of photons; a sensing layer configured to generate charges upon impinging of the photons through the window layer; and a bottom electrode layer comprising at least one bottom electrode for receiving charges generated in the sensing layer. The sensing layer is sandwiched between the window layer and the bottom electrode layer. The at least one bottom electrode of the bottom electrode layer comprises conductive material with reflectivity higher than 0.7 to reflect back received photons into the sensing layer; and the at least one bottom electrode is obtained by semiconductor device fabrication techniques.

23 Claims, 5 Drawing Sheets

(56) References Cited

U.S. PATENT DOCUMENTS

2013/0062593 A1  3/2013  Jones et al.
2013/0240962 A1  9/2013  Wang et al.

OTHER PUBLICATIONS

Extended European Search Report in European Patent Application No. 19206657.9, dated Mar. 6, 2020.
Gorokhovsky et al. "Characterization of large area filtered arc deposition technology: part I—plasma processing parameters," *Surface and Coatings Technology*, vol. 140, pp. 82-92, 2001.
Hu et al. "New design for highly durable infrared-reflective coatings," *Light: Science & Applications*, vol. 7, 17175, 2017.
Tanaka, et al. "Properties of titanium nitride film deposited by ionized metal plasma source," *Journal of Vacuum Science & Technology B: Microelectronicsprocessing and Phenomena, American Vacuum Society*, vol. 17(2), pp. 416-422, Mar. 1999.

\* cited by examiner

OPTICAL SENSOR AND THIN FILM PHOTODIODE

CROSS-REFERENCE TO RELATED APPLICATIONS

This application claims foreign priority to EP 19206657.9 filed Oct. 31, 2019, the contents of which are incorporated by reference herein in their entirety.

BACKGROUND OF THE INVENTION

Technological Field

The disclosed technology relates to the field of radiation sensors. More specifically, the disclosed technology relates to photonic converters such as thin film photodiodes, a method of manufacture, and an optical sensor for use therewith.

Description of the Related Technology

Technology advancements may lead to increased integration with respect to sensing devices. Integrated sensing devices, such as thin film photodiodes (TFPD) and related photonic devices, include a stack of layered materials with specific functions. These stacks may include a photo-active layer sandwiched between a bottom electrode and a top electrode.

Generally, the top electrode is made of conductive, transparent material so that the photodiode stack can receive radiation. The photo-active layer may comprise a layer of material which converts impinging photons into charge carriers, for example, a photodiode layer. When photons are injected into the photo-active layer through the transparent top electrode, pairs of electrons and holes are generated and extracted to the electrodes as an output signal. This output signal is then transmitted to a readout circuit, which in TFPDs is generally a readout integrated circuit (RoIC).

The photo-active layer should ideally absorb the totality of impinging photons to maximize radiation conversion efficiency. However, in practice, the absorbance of radiation by the photo-active layer is not total or complete due to the limited photon absorbance of the photo-active layer. Some photons may travel through the sensing layer without being absorbed. This may degrade efficiency of these sensing devices.

Sensitivity may also be reduced by presence of contaminants, as these sensors may involve mixed manufacturing techniques, and there is a risk of oxidation and contamination during the transition between techniques.

To improve the photon absorbance of the thin film, one possible solution is to increase the photo-active layer thickness, and thus increase the possibility of photon-absorbance inside the thin film. However, this also increases the cost and the difficulty of device integration. Moreover, increasing the photo-active thin film thickness leads to a higher possibility of carrier recombination, because the diffusion length of the generated carriers is shorter than the thickness of the photo-active layer.

SUMMARY OF CERTAIN INVENTIVE ASPECTS

It is an object of embodiments of the disclosed technology to provide a radiation sensor, in particular an optical sensor, based on photon conversion with high conversion efficiency, the sensor including a layered stack with a low amount of or no contaminants or oxidation interfaces between the layers. A method of fabrication and the use of the sensor in a thin film photodiode are also provided.

In a first aspect, the disclosed technology provides an optical sensor comprising stacked layers comprising
 a window layer which allows the passage of photons,
 a sensing layer for generating charges upon impinging of the photons through the window layer,
 a bottom electrode layer comprising at least one bottom electrode for receiving charges generated in the sensing layer.

The sensing layer is sandwiched between the window layer and the bottom electrode layer. The at least one bottom electrode of the bottom electrode layer comprises conductive material with reflectivity higher than 0.7 to reflect back received photons into the sensing layer, the at least one bottom electrode being obtained by semiconductor device fabrication techniques.

It is an advantage of embodiments of the disclosed technology that an efficiency of absorbance of the sensing layer is improved. In some embodiments of the disclosed technology, the sensing layer comprises at least one thin film photodiode layer. It is another advantage of embodiments of the disclosed technology that the optical sensor can be highly integrable.

In some embodiments of the disclosed technology, the window layer of the optical sensor comprises at least one transparent top electrode.

It is an advantage of embodiments of the disclosed technology that the window layer can act as top electrode in a TFPD configuration.

In some embodiments of the disclosed technology, the at least one bottom electrode comprises a titanium-based binary (Ti—X) or ternary (Ti—X—Y) metal compound.

It is an advantage of embodiments of the disclosed technology that the electrode has a very low transmittivity and high reflectivity. It can also be provided using CMOS-compatible processes.

In particular, the titanium-based compound may comprise titanium nitride. It is an advantage of embodiments of the disclosed technology that the electrode can be provided very easily with well-known techniques.

In some embodiments of the disclosed technology, the at least one bottom electrode comprises multiple sub-layers forming a stack. The sub-layer closest to the sensing layer is more reflective than the sub-layer away from the sensing layer.

It is an advantage of embodiments of the disclosed technology that the electrode can be tailored to have different properties in different surfaces, e.g. a reflective surface facing the sensing layer, e.g. in direct contact with the sensing layer, and a surface providing good adhesion to a contact, e.g. a copper contact.

In particular embodiments, the crystallites of the sub-layer closest to the sensing layer have a preferred (2,0,0) orientation, while crystallites of the sub-layer away from the sensing layer have a preferred (1,1,1) orientation.

In some embodiments of the disclosed technology, the optical sensor further comprises a readout circuit provided on a substrate, electrically connected to the at least one bottom electrode.

It is an advantage of embodiments of the disclosed technology that reliable contact vias are obtained.

In particular embodiments, the optical sensor further comprises a contact layer comprising at least one contact. The at least one contact is electrically connected to the at least one bottom electrode, for providing electrical connection between the at least one bottom electrode and the readout circuit.

It is an advantage of embodiments of the disclosed technology that the sensor can be compatible with "Back-end-of-Line" (BEOL) processing. In some embodiments including a plurality of contacts, a further insulation layer may be provided between the contacts for protecting the substrate and providing electric contact to the readout circuit only where required, as well as to protect the semiconductor of the substrate from optical illumination.

In a second aspect, a method of manufacturing the optical sensor, for example the optical sensor of the first aspect of the disclosed technology. The method comprises providing a sensing layer and providing a bottom electrode layer on a surface of the sensing layer, thus covering at least part of the area of the surface of the sensing layer.

Providing the bottom electrode layer comprises providing at least one bottom electrode comprising conductive material with a reflectivity higher than 0.7. The bottom electrode layer is provided using semiconductor device manufacturing techniques.

It is an advantage of embodiments of the disclosed technology that a TFPD stack can be provided for an optical sensor with good efficiency by providing a reflective surface on the surface of the sensing layer opposite to the zone where illumination is received, where the reflective surface serves as an electrode, and can be provided by deposition techniques compatible with semiconductor processing.

In some embodiments of the disclosed technology, providing the bottom electrode layer comprises providing titanium-based binary or ternary metal compound.

It is an advantage of embodiments of the disclosed technology that such bottom electrode layer can be provided easily using semiconductor device processing, e.g. CMOS/fab manufacturing techniques, e.g. by deposition, in a highly controlled environment. In particular, providing the bottom electrode layer comprises providing titanium nitride.

In some embodiments of the disclosed technology, providing the bottom electrode layer comprises depositing multiple sub-layers forming a stack.

It is an advantage of embodiments of the disclosed technology that the properties can be tailored for different purposes, including good adhesion for one layer and good reflectivity for a different layer, for example, a first layer may be deposited with low risk of damaging the region where the deposition is provided, and a layer with very high reflectivity can be provided in optical contact with the sensing layer.

In particular embodiments, depositing multiple layers comprises depositing a sub-layer at temperature under 50° C., and subsequently depositing a sub-layer on top at a temperature over 200° C.

It is an advantage of embodiments of the disclosed technology that such bottom electrode layer can be provided easily using semiconductor device processing, e.g. CMOS/fab manufacturing techniques, e.g. by deposition, in a highly controlled environment.

In particular embodiments, depositing multiple layers comprises depositing a bi-layer including a first TiN layer provided by cathode arc physical vapor deposition and a second TiN layer, between the first layer and the sensing layer, provided by ionized metal plasma physical vapor deposition.

It is an advantage of embodiments of the disclosed technology that TiN is a material with very high reflectivity and inert, so it barely reacts or oxidizes during deposition. It is a further advantage that the deposition conditions can be accurately controlled.

In a further aspect, the disclosed technology provides the use of an optical sensor in accordance with embodiments of the first aspect in a thin-film photodiode. The disclosed technology also provides a thin-film photodiode comprising an optical sensor in accordance with embodiments of the first aspect of the disclosed technology.

It is an advantage of embodiments of the disclosed technology that a multilayer electrode can be used in a TFPD-based sensor as a mirror surface for photons which entered the sensing layer but were not converted to charge carriers. The mirror surface reflects back these photons into the material of the sensing layer, which improves the EQE.

Particular and preferred aspects of the disclosed technology are set out in the accompanying independent and dependent claims. Features from the dependent claims may be combined with features of the independent claims and with features of other dependent claims as appropriate and not merely as explicitly set out in the claims.

These and other aspects of the disclosed technology will be apparent from and elucidated with reference to the embodiment(s) described hereinafter.

BRIEF DESCRIPTION OF THE DRAWINGS

The above described aspects and implementations are explained in the following description of embodiments with respect to the enclosed drawings.

Figure 1:
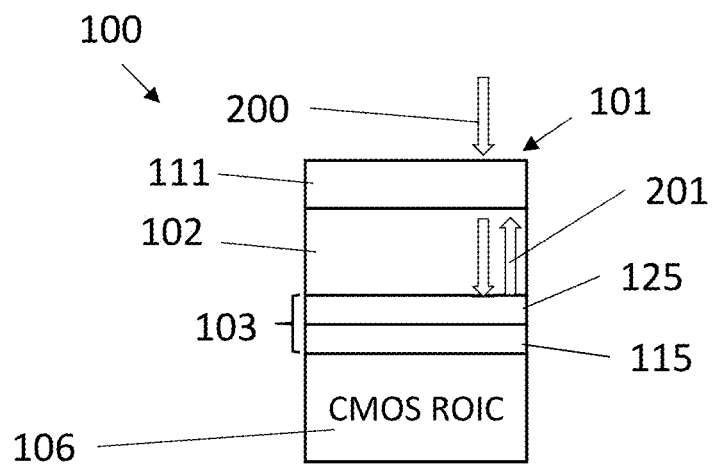
FIG. 1 shows a schematic cross section of an optical sensor and its stacked layers, in accordance with embodiments of the disclosed technology.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed technology is not limited thereto but only by the claims. The dimensions and the relative dimensions do not correspond to actual reductions to practice of the disclosed technology.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the disclosed technology, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In other instances, well-known methods, structures and techniques have not been shown in detail in order not to obscure an understanding of this description.

Where in embodiments of the disclosed technology reference is made to "transmittance" of a material, reference is made to the energy ratio between the radiation falling on a material and the radiation transmitted through it, which is a property dependent on radiation type. Some materials will be highly transparent for a radiation wavelength within a predetermined range, while reducing or blocking the passage of radiation with a wavelength in other ranges.

Where in embodiments of the disclosed technology reference is made to "reflectivity" of a material, reference is made to the energy ratio between the radiation falling on a material and the radiation reflected, which is also a property dependent on radiation type as before. A highly reflective material usually has low transmittance for radiation of the same wavelength.

Where in embodiments of the disclosed technology reference is made to "sensing layer", reference is made to a layer in the stack comprising a layer of material that absorbs energy from radiation with a wavelength within a predetermined range, while absorbing less or not absorbing radiation with a wavelength in other ranges, and presents a measurable reaction (e.g. generation of charges). This layer of material in the sensing layer occupies a predetermined area within said sensing layer and receives the name of "sensing element".

The disclosed technology relates to a photon conversion device, in particular an optical sensor, which receives radiation (photons) through a window with high transmittance. The window and the sensing element are adapted, so that the window presents high transmittance to radiation within a wavelength range at least overlapping with the wavelength range that the sensing element is susceptible to absorb (or "radiation of interest"). Such radiation of interest may be visible radiation (photons), and/or e.g. infrared radiation or near-infrared radiation. In some embodiments of the disclosed technology, the sensing layer of the photon conversion device comprises a photodiode.

The external quantum efficiency (EQE) of photon conversion devices depend on the amount of photons absorbed by the sensing layer compared to the amount of photons impinging the sensing layer. In the particular case of photodiodes, the EQE may be defined as the ratio of the charge carrier number collected by the photodiode versus the number of photons of a given energy projected on the photodiode. The EQE is reduced when the thickness of the sensing layer decreases. As already explained, a photon conversion device is preferably thin enough to provide good integration, which is difficult to combine with good absorbance of the sensing layer.

The disclosed technology provides a photon conversion device with a thin sensing layer, and a bottom electrode with high reflectivity, to ensure that photons do not trespass into the bottom electrode, being reflected on the surface thereof, and increasing the chances of being absorbed and generate charge carriers.

Such bottom electrode provides also protection against parasitic light sensitivity (PSL) of the device. More in detail, in existing optical sensors based on thin-film photodiodes (TFPDs), part of the photons may cross the thin sensing layer (e.g. photodiode) without being absorbed, and travel through the bottom electrode if it is not reflective and thick enough. This would cause that the photons project onto the readout circuit, which is usually a semiconductor device (e.g. a silicon device), which causes worsening of the PSL. Increasing the thickness of the bottom electrode, as already explained, is not compatible with the high compactness required for integrated devices.

The disclosed technology provides a bottom electrode that not only provides good reflectivity, ensuring high EQE, but also protects the semiconductor substrate of the readout circuit from stray photons or the like. Although highly reflective materials such as noble metals (gold, silver, etc.) can be introduced as bottom electrodes, they are usually expensive, and the method of manufacture is not compatible with semiconductor processing. This leads to introduction of oxidation and contamination in the interfaces between layers. In embodiments of the disclosed technology, the bottom electrode is provided with low or no contamination at the contacts between the readout circuit and the sensing layer, by providing the bottom electrode with methods that are compatible with semiconductor device processing (e.g. CMOS processing, fab processing).

The bottom electrode may comprise titanium-based binary or ternary metal compounds, which can be provided by CMOS or fab processing, for example titanium nitride. For example, it may comprise a multilayer of material that can be provided by semiconductor device processing techniques. A list of such bottom electrode materials includes such metals as Al, Co, Cu, Mo, Nb, Ni, Ru, Ta, Ti, W and the silicide compound and the nitride compound of these metals. For example, the electrode may comprise a first layer, distal from the sensing layer, for example, between a readout circuit and a second layer, which may directly receive charges from the sensing layer, for example, the sensing layer may be deposited or otherwise provided on the second layer. The first layer may present good adhesion with any contact of the readout circuit, and it may be provided in conditions such that the readout circuit is not submitted to stress. For example, a semiconductor wafer does not bow when provided with the first layer, for example by providing it at low temperatures, such as at room temperature, for example, under 50° C. Parameters such as the material thickness and deposition process temperature also influence the stress level. The differences of thermal expansion coefficient between the semiconductor (e.g. Si) and the metal of the electrode may generate high stress for temperatures much higher than the room temperature. The second layer may be tailored to present very high reflection. For example, the multilayer stack may be a bilayer, e.g. a TiN layer. The electrode may be provided by PVD. For example, the electrode may comprise a first TiN layer provided by cathodic arc deposition and a second TiN layer provided by ionized metal plasma deposition.

In a first aspect, the disclosed technology provides a photon conversion device being a radiation sensor, in particular an optical sensor, including a layer through which the radiation can be received by a sensing layer, the sensing layer which generates charge carriers upon receiving radiation in the form of photons, and a bottom electrode layer which connects the sensing layer to a readout circuit. The bottom electrode is in optical contact with the sensing layer, so radiation of interest can be reflected back and photons not converted to charge carriers are kept inside of the material of the sensing layer to increase the chance of conversion to a charge carrier. The reflectivity, for example of the bottom electrode, may be, for example, 0.7 or higher, around 0.8, or higher than 0.8.

A reflective surface or surfaces (for example, one or more mirrors), occupying an area large enough to provide good reflection, are provided on the surface of the sensing layer opposite to the surface where radiation is received. This reflective surface or surfaces may serve also as a bottom electrode for connecting the sensing layer to the readout circuit which gives a readout signal as a function of the charge carriers. The reflective surface(s) are part of a bottom electrode layer. The bottom electrode layer can be provided by deposition techniques which are compatible with semiconductor processing.

FIG. 1 schematically shows a cross section of an optical sensor 100 and its stacked layers, including a top window layer 101 (for example, a layer transparent to photons) that allows the passage of radiation 200, where the radiation 200 enters in a sensing layer 102, which may include a photodiode stack. The sensing layer 102 provides a response to the radiation 200 (for example, a generation of charges) that is transmitted through a bottom electrode layer 103, for example, to a readout circuit layer 106 (for example, a complementary metal-oxide-semiconductor (CMOS) RoIC, which may provide a signal based on the received response.

The bottom electrode layer 103 may block radiation (photons) of the radiation 200 and provides a reflective surface over which incident photons 201 can be reflected and absorbed within the sensing layer 102. The reflectivity of the bottom electrode layer 103 may be 0.7 or higher, for example 0.8 or higher, in order to reduce optical loss or avoid any optical loss.

Figure 2:
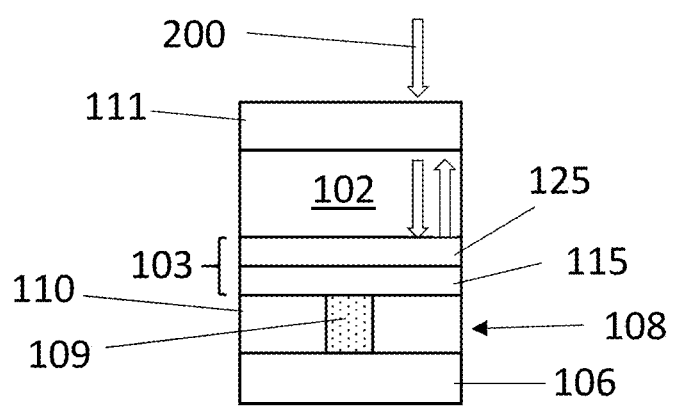
FIG. 2 shows a cross section of a single-pixel implementation for an imager, including a contact layer, in accordance with embodiments of the disclosed technology.

FIG. 2 shows a single pixel configuration including the stack of layers shown in FIG. 1, further showing a contact layer 108 for providing electric contact between the readout circuit 106 and the sensing layer 102, in particular between the readout circuit 106 and the bottom electrode layer 103, for example, comprising at least one electrode.

Each layer of the optical sensor 100 may comprise a uniform layer of functional material, or islands of functional material separated from each other. For example, the contact layer 108 may comprise a plurality of islands of functional material; in particular a plurality of contacts 109 separated by insulating material, forming an insulating matrix 110, as shown in FIG. 2 and in FIG. 3.

Figure 3:
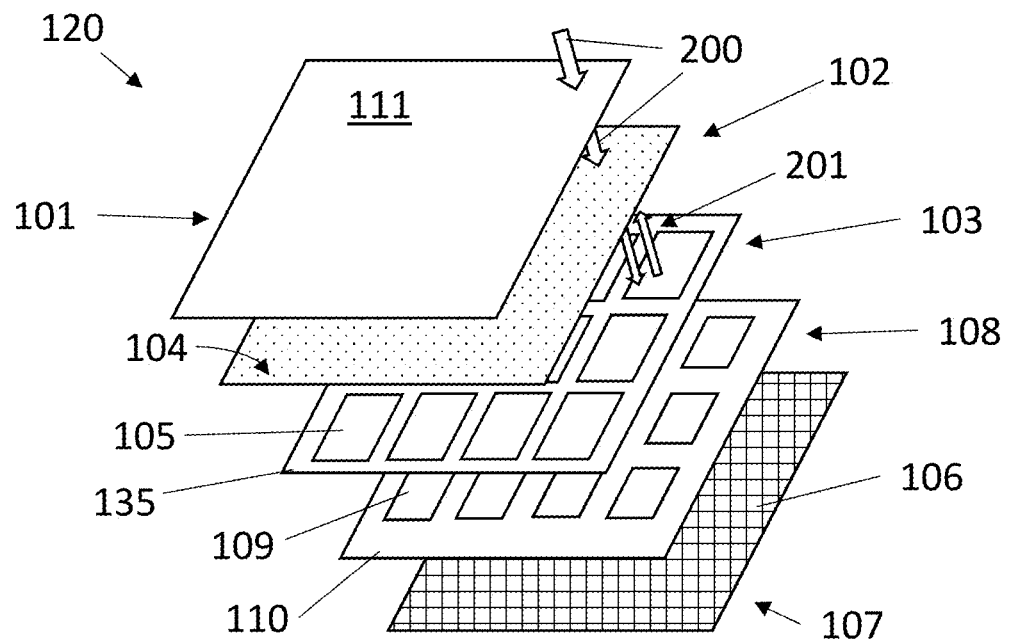
FIG. 3 illustrates an exploded perspective view of an optical sensor formed by stacked layers, showing the interaction behavior of radiation with the different layers, in accordance with embodiments of the disclosed technology.

FIG. 3 schematically shows an exploded perspective view of the optical sensor 100, comprising the top window layer 101 with high transmittance to photons, and the sensing layer 102 which receives impinging photons 200 through the top window layer 101. The bottom electrode layer 103 including conductive material, for example, a plurality of electrodes 105, is placed facing the surface of the sensing layer 102 opposite to the surface 104 facing the window layer 101. For example, the bottom electrode layer 103 may be in electric contact with the sensing layer 102.

In some embodiments, the window layer 101 may comprise a single window, the sensing layer 102 may comprise a uniform layer of photoactive material, for example, a photodiode. In this case, each of the electrodes 105 may provide a reflective surface, so the reflective surface provided by the electrode layer 103 is disjoined while being congruent enough to effectively block photons and providing enough reflection of incident photons. The reflectivity of the electrodes may be 0.7 or higher, for example 0.8 or higher, as before.

However, the disclosed technology is not limited to this configuration, and other configurations (for example, a plurality of windows, and/or a plurality of sensing elements, for example, a plurality of photodiodes laid out next to each other, and/or a single bottom electrode) or a configuration thereof can be used.

The optical sensor 100 may also comprise the readout circuit 106, provided, for example, in a substrate layer 107. The substrate layer 107 may be a semiconductor substrate, for example, a silicon substrate such as a silicon wafer. The substrate may be provided by CMOS processing. For example, the readout circuit 106 may be a readout integrated circuit (RoIC) in a semiconductor wafer. The readout circuit 106 may receive charge carriers from the sensing layer 102 through the bottom electrode layer 103, for generating readout signals representative of the impinging radiation, its intensity, distribution, etc.

In the particular example of FIG. 3, where a plurality of electrodes 105 are laid out in the bottom electrode layer 103, the contact layer 108 may include a plurality of contacts 109 which may be embedded in the insulation matrix 110 (for example, made of an electrical insulator) which may protect the substrate 107 and circuit 106 therein, avoiding passing of charges into the circuit except through the contact 109, and possibly also providing protection of the substrate against impinging radiation (for example, illumination).

In some embodiments, a plurality of the bottom electrodes 105 are surrounded by insulating material, for example, an insulation matrix 135, as shown in FIG. 3. The plurality of bottom electrodes 105 are electrically connected (for example, by ohmic connection) respectively to a plurality of contacts 109 of the contact layer 108, which may be "Back-end-of-Line" (BEOL) contacts, for example, comprising copper. The bottom electrode 105 may further provide good adhesion to the contact layer 108, for example, to the contacts 109 thereof.

The bottom electrode layer 103 not only enhances the absorption of photons in the sensing layer 102, but also protects the readout circuit 106 in the substrate 107. This can be provided with no need to increase thickness of the electrode. For example, the bottom electrode 105 (or the layer itself) may have a thickness between 50 nm and 500 nm, for example, 100 nm, or 200 nm.

In some embodiments, the window layer 101 may comprise a top electrode 111 or a plurality thereof. The top electrode 111 may be electrically connected to a voltage bias, for example, to a ground bias. The top electrode 111 may comprise conductive material with a high transmittance to photons 200. For example, the top electrode 111 may comprise or consist of tin-doped indium oxide (ITO), and/or fluorine-doped tin oxide (FTO), and/or aluminum-doped zinc oxide, and/or zinc-doped indium oxide (IZO), and/or gallium doped zinc oxide, etc. The window layer 101 may comprise optical elements, such as filters, lenses, etc.

In some embodiments, the sensing layer 102 may comprise material adapted to form a photodiode, such as a thin film photodiode. The disclosed technology increases flexibility of design. In existing optical devices, in order to increase efficiency and protect underlying circuitry, the thickness of the sensing layer needs to be higher than a predetermined thickness if using materials which do not completely block radiation under that predetermined thickness. This condition of thickness can be relaxed in embodiments of the disclosed technology, as the sensing layer (for example, photodetectors therein) do not need to absorb all the radiation in the first pass, because it will be reflected by the bottom electrode 105 thus increasing the chances of absorption in the sensing layer. For example, the sensing layer 102 may comprise organic and/or perovskite diodes, quantum-dot based diodes, metal-oxide photodetectors, and the like. With thin film photodiode, it is meant that the sensing layer 102 includes a photoactive thin film with a thickness between 50 nm and 500 nm. As mentioned before, the sensing layer 102 may also comprise a plurality of photodiodes in contiguous zones along the area of the sensing layer 102.

In some embodiments, the bottom electrode layer 103 comprises highly reflective material, including material which can be provided with semiconductor manufacturing techniques, such as ceramics, semiconductors, semimetals or metals. For example, the bottom electrode layer 103, or at least one bottom electrode 105 of the electrode layer 103, comprises or consists of titanium binary or ternary metal compounds, for example titanium nitride (TiN). An incomplete list of such bottom electrode materials includes such metals as Al, Co, Cu, Mo, Nb, Ni, Ru, Ta, Ti, W and the silicide compound and the nitride compound of these metals. Hence, the bottom electrode may act at the same time as a reflection mirror. Such a bottom electrode can reflect the un-absorbed photons back to the sensing layer 102 for example, to the photo active thin film). This can double the effective sensing layer thickness without physically increasing the sensing layer thickness. Therefore, a bottom electrode with high optical reflectivity and low optical transmittance can be used to enhance the optical sensitivity and reduce the PLS impact.

Moreover, by using a high reflectivity, low transmittance bottom layer (for example, including metal or compounds thereof), that is compatible with fab processing, the photoabsorbance of the sensor is improved, with highly pure contacts and good adhesion between the different layers, because providing all the layers in the same processing flow reduces contamination. This usually cannot be provided by using reflective materials such as Ag or Au.

Figure 4:
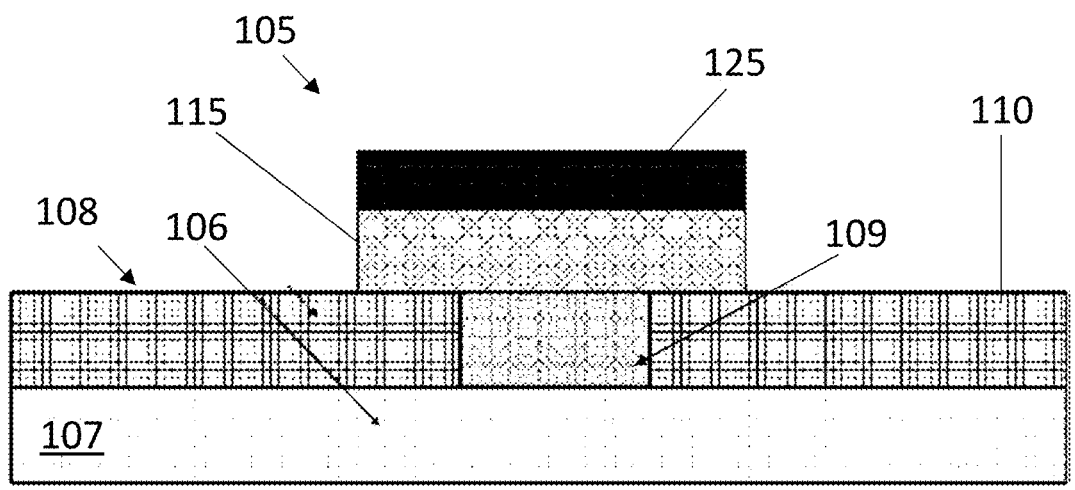
FIG. 4 is a cross section of a bottom electrode, a substrate or chip including a readout circuit, and a contact layer providing electric contact between the sensing layer and the readout circuit, for use in an optical sensor in accordance with embodiments of the disclosed technology.

FIG. 4 shows such exemplary bottom stack electrode 105, further showing the contact layer 108 and the substrate 107. In general, the connection between the readout circuit and the sensing element can be made via a multilayered electrode stack. For instance, FIG. 1 shows that the bottom electrode layer 103 is a stack including two layers 115, 125 forming at least one electrode. In particular embodiments, such as in FIG. 4, the bottom electrode layer 103 comprises electrodes 105 (only one is shown in FIG. 4) formed by a stacked layers. The different layers of the bottom stack may be tailored to provide different effects, by optimizing its characteristics in accordance with its function. The sub-layer 125 of the stack, which faces the sensing layer 102, may receive the response (for example, photocharges) generated in the sensing layer 102. In some embodiments of the disclosed technology, the sub-layer 125 is in physical contact with the sensing layer 102. This sub-layer 125 may be optimized to provide highest reflectivity, while the bottom sub-layer 115 closest to the substrate 107 may provide good adhesion and protection, even at expense of reflectivity, which may not be so critical in the bottom sub-layer 115 of the bottom stack electrode 105. The disclosed technology is not limited to two sub-layers of the bottom stack electrode 105, and other intermediate layers may be provided between the top and bottom sub-layers 125, 115 of the bottom stack electrode 105.

Any suitable material or materials can be used for the layer stack electrode 105. As explained earlier, it is preferred to reduce contamination during processing, so the materials should be preferably compatible with CMOS processing. The conductive materials should be also preferably resistant to oxidation (which may change work function and even reduce conductivity, for example in case of aluminum) and relatively inert to the presence of surrounding materials such as the photosensitive materials and to the processing materials (for example, solvents), for providing uniformity of the bottom stack electrode 105. Other parameters, such as melting point, grain boundary configuration, etc. may influence the choice.

In a particular example, the bottom electrode layer is a stack comprising or consisting of two opposite layers of TiN. One of the sub-layers is provided by ionized metal plasma (IMP) deposition cathode arc (ARC) deposition. It receives charge carriers from the sensing layer 102 and reflects photons impinging thereon from the sensing layer and not absorbed by said sensing layer. The other sub-layer is provided by cathode arcing (ARC). It provides electrical contact between the IMP layer and the readout circuit 106. Structural differences may be allowed by the particular physical vapor deposition method used. The sub-layer closest to the sensing layer may comprise crystallites (for example, TiN crystallites) with the preferred (200) orientation. The sub-layer opposite to the sensing layer, for example, the sub-layer closest to the readout circuit layer, may comprise crystallites (for example, TiN crystallites) with the preferred (111) orientation.

For example, a pixel of an optical sensor may comprise a bottom electrode 105 formed by a bi-layer of titanium nitride.

The bi-layer is formed, comprising a sub-layer 115, for example, a TiN layer 115, which may be provided by ARC deposition over the contact 109, for example, the BEOL copper contact, of the contact layer 108. The ARC deposition is compatible with the Cu metallization of the circuit 106 as it can be provided at room temperature. In some embodiments, the TiN sub-layer 115 provided by ARC deposition is provided on the contact 109 and further extends over at least part of the surface of the insulation matrix 110 embedding the contact 109, so it is encapsulated between the substrate 107, the insulation matrix 110 and the TiN sub-layer 115 provided by ARC deposition.

On top thereof, a further sub-layer 125, for example, a second TiN sub-layer is provided by IMP deposition. Said TiN sub-layer 125 presents a very high reflectivity, higher than the underlying sub-layer 115 provided by ARC deposition. Although high temperatures are reached in this method of deposition, the contact 109 and underlying substrate 107 will be protected from thermal damage and/or oxidation.

It is noted that both arc deposition and IMP deposition can be provided in a PVD sputtering chamber or cluster, compatible with semiconductor fabrication techniques, for example, CMOS processing. Thus, there is no need to change processing installation or the like, allowing reducing contamination. Further, both ARC and IMP depositions can be provided under vacuum, and the transition between one deposition technique and the other can be realized without having to break vacuum. Thus, no oxidation may be present in the interface between the multiple layers of the electrode (for example, two layers of the bi-layer electrode 105).

It is noted that this would happen if instead of TiN, any other highly reflective bi-layer comprising a compound (for example, semiconductor, semimetal, ceramic, metal) is provided by ARC and IMP depositions, such as for example silicide and/or nitride compounds of metals such as Al, Co, Cu, Mo, Nb, Ni, Ru, Ta, W, Ti. The bottom stack electrode 105 can be provided with sub-layers having different structures, reflectivity and crystallographic quality, with no oxide or impurity layers between them.

The disclosed technology is not limited to ARC and IMP deposition techniques, and other similar techniques can be applied which allow forming a first layer by low temperature deposition close to the readout circuit 106 (for example, on the contact 109) and forming a second layer on top of the first by deposition of highly reflective layer, even at high temperature, as the readout circuit 106 (and/or contact 109) would be protected.

The first (bottom) layer of the stack electrode 105 (for example, the TiN layer 115 provided by ARC deposition) may have a thickness of for example, 50 nm. The thickness of the electrode 105 is, for example, 100 nm or less than 200 nm which shows a good compromise between compactness of the electrode and its shielding effect. The disclosed technology is not limited to these thicknesses and others can be used, for example between 50 nm and 500 nm, or other thicknesses that reduce photons reaching the underlying substrate.

Figure 5:
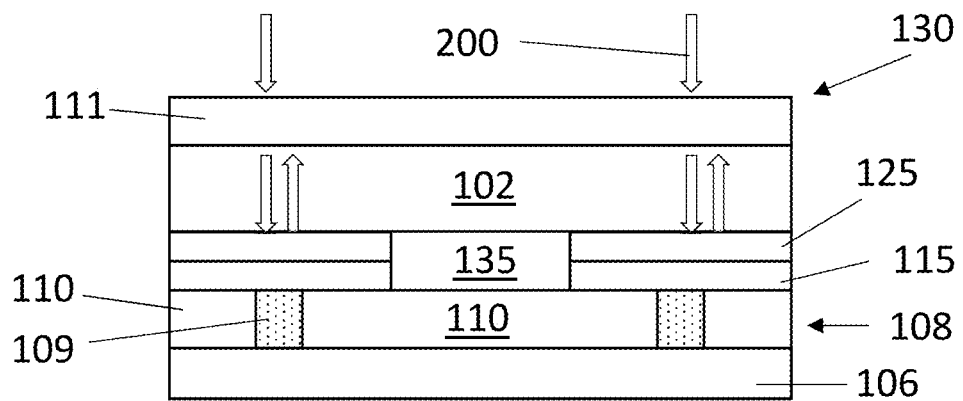
FIG. 5 shows a cross section of a multi-pixel implementation for an imager, in accordance with embodiments of the disclosed technology.

FIG. 5 shows the cross section of an exemplary multi-pixel 120 configuration in accordance to embodiments of the disclosed technology. The multi-pixel configuration 120 may have a structure similar to the structure shown in FIG. 3. A multi-pixel may comprise a transparent top electrode 111, a sensing layer 102 (for example, photodiode stack) in contact with a bottom electrode layer 103, for example, comprising a plurality of (for example, two) bottom electrode stacks 105 separated by a matrix 135 comprising or consisting of insulating material. Each electrode stack 105 may be in electrical contact with the readout circuit 106, for example, a CMOS RoIC, through a contact 109, for example, a via BEOL. The plurality of vias may be separated by further insulating material.

The optical sensor of embodiments of the disclosed technology can be implemented in an imager, for example in the single pixel and/or multi-pixel configurations.

In a second aspect, the disclosed technology provides a method of manufacturing an optical sensor. For example, the method may provide an optical sensor in accordance with embodiments of the first aspect of the disclosed technology. The method includes providing a photon conversion device in a layered stack, including a sensing layer adapted to receive radiation (photons) over one of its surfaces and convert photons into charge carriers.

The method includes also providing a bottom electrode layer, on the surface opposite to the surface over which the sensing layer receives photons, which is highly reflective and with low transmittance. The bottom electrode layer may be provided between the sensing layer and a readout circuit, for example a readout circuit on a substrate. It can be also seen as providing a mirror or mirrors on the surface of the sensing layer opposite to the surface where photons are received by the sensing layer, where the mirror includes conductive material and may act as a bottom electrode of the optical sensor.

Thus, the bottom electrode layer may comprise at least one electrode with high reflectivity. Providing such electrode may comprise providing a stack electrode, for example by physical vapor deposition (PVD) technique, and/or related techniques available in a semiconductor device manufacture installation, for example, a deposition technique which can be provided in a PVD chamber. Providing the stack electrode may comprise providing a first layer by low temperature deposition over the readout circuit and/or any contacts therein (for example, on a contact layer), thus protecting the semiconductor circuit and any contact herein. Further, a second layer can be provided on top of the first layer, the second layer having high reflectivity, for example, higher than the reflectivity of the first layer. Due to the protection offered by the first layer, the deposition of the second layer has more relaxed thermal requirements than the first layer, so deposition techniques potentially dangerous for the integrity of the readout circuit or the contacts can be used for the second layer.

Figure 6:
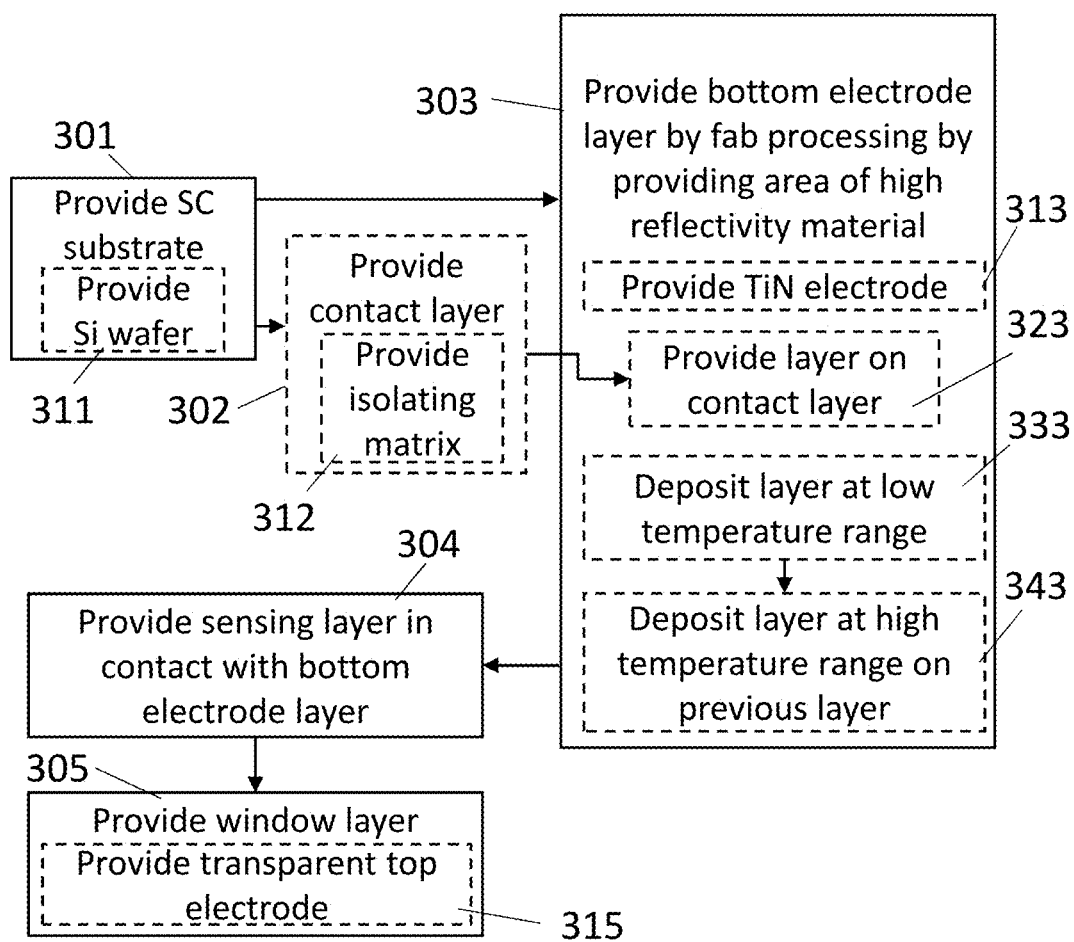
FIG. 6 shows a block diagram with an exemplary sequence of steps for manufacturing an optical sensor in accordance with embodiments of the disclosed technology.

FIG. 6 shows an exemplary sequence of steps in accordance with embodiments of the second aspect of the disclosed technology. The method includes providing 301 a semiconductor substrate, for example providing 311 a silicon wafer. Providing a substrate may comprise providing readout circuit on the substrate, or providing a substrate comparing a readout circuit.

In some embodiments, a contact layer can be optionally provided 302 for providing one or preferably more contacts. The contacts may be provided 302 in Back-end-of-line (BEOL) processing. They may be copper contacts. An isolating matrix can also be provided 312 for electrically insulating the contacts from each other. The matrix may be polymeric, for example, SiO2, SiN, SiCN, SiOC and/or SiOCH based low-k dielectric films, or polymer-based low-k dielectric films.

Then, an electrode layer is provided 303, preferably by semiconductor processing techniques (or "fab processing"), in particular CMOS processing, on the substrate, for providing the readout circuit of the substrate with electrodes. For example, titanium-based binary or ternary metal compounds, such as TiN, can be provided 313, forming at least one bottom electrode. The electrode layer may be provided 323 over the contact layer of the readout circuit. Other materials may be used, as explained in embodiments of the first aspect.

The bottom layer may be provided in multiple steps. For example, a bottom electrode with multiple layers may be provided 333,343, tailoring the deposition for improving selectively some properties. For example, the first sub-layer of the electrode layer may be deposited 333 at low temperature, for example not surpassing 100° C.; for example, it may be deposited at around 50° C., for example, by cathode arc (ARC), or any other PVD technique which allows good adhesion and no risk for the wafer. The temperature may not be as high so as to damage the readout circuit of the substrate, or to cause deformation of the substrate or contamination over the contacts.

Then, a second sub-layer may be deposited 343 at high temperature, for example by ionized metal plasma (IMP). This allows providing material with a better reflectivity than cathodic arc, without the risk of damaging or bending the substrate (for example, wafer) or contaminating the contacts, as the substrate and any contact are protected by the first sub-layer of the electrode.

For example, the electrode layer may comprise or consist of a first TiN sub-layer deposited by ARC with a thickness between 50 nm and 100 nm, and a second TiN sub-layer provided by IMP with a thickness between 20 nm and 100 nm.

It is noted that the one or more contacts should be provided so that they may contact the sensing layer on a portion of its surface, so the one or more electrodes may include a top surface with a predetermined area. Providing the electrode layer 303 may comprise providing an insulating matrix extending laterally between electrodes of the electrode layer, leaving the contact surfaces free of insulating material.

In the particular example of TiN deposition, a double layer of TiN may be provided, for example over a contact layer comprising copper contacts.

There are different TiN deposition techniques available in semiconductor fabs. Ionized Metal Plasma (IMP) TiN is found to have a higher reflectivity than cathodic arc (ARC) TiN. To reduce the photon transmittance through the metal bottom electrode, the TiN thickness can be made thick enough, for example, over 200 nm. However, due to the high deposition temperature (~350° C.), IMP TiN will introduce higher stress (thus wafer bow) with the TiN thickness increase, which makes the wafer chucking difficult during the following process steps. The high deposition temperature of IMP TiN also makes it difficult to integrate with CMOS RoIC with Cu metallization in the BEOL part, since Cu may be oxidized by the residue oxygen in the chamber and create an oxidized surface with high contact resistance and low adhesion strength.

To over-come these problems, embodiments of the disclosed technology allow leverage the benefits of two PVD TiN metal layers, such as IMP TiN and ARC TiN. By stacking an IMP TiN on top of ARC TiN, we can increase the bottom electrode reflectivity without introducing too high wafer bow/stress. The crystallinity of the sub-layers of the bottom electrode may be different. For example, the sub-layer closest to the circuitry may comprise grains or crystallites with a texture or preferred orientation following the (1,1,1) direction, while the sub-layer closest to the sensing layer may comprise grains or crystallites with a texture or preferred orientation following the (2,0,0) direction.

Such a bi-layer TiN can be deposited 333,343 in a commercial PVD sputtering cluster without vacuum break. Therefore, no interface titanium oxide layer exists, and strong adhesion between the two TiN layers is guaranteed. The wafer is at room temperature during ARC TiN deposition which also makes this bi-layer TiN stack compatible with Cu metallization from the chip (or in general, substrate including a readout circuit) underneath. No Cu will be oxidized during the ARC TiN deposition, and the Cu metallization is completely encapsulated by ARC TiN during IMP TiN deposition. The thickness of the bottom electrode should be large enough to provide good optical performance, but not so large as to cause wafer bow. For example, the bottom electrode may be 200 nm thick, or even less, for example, 100 nm thick, thus improving compactness.

Then, the sensing layer may be provided 304, so that charge carriers generated therein can generate a readable signal through the electrodes and optional contacts of the readout circuit. This may include providing a semiconductor sensing layer, for example, a photodiode layer. For example, a multilayer stack including a layer with photosensitive material may be provided, thus obtaining a thin film photodiode. Providing the sensing layer may comprise spin coating, printing, thermal evaporation, etc. which are inexpensive and well known. The disclosed technology is not limited to these techniques, and other techniques such as electron beam evaporation, sputtering, ALD or CVD can also be used. Some of the layers of the multilayer stack, including the sensing layer, may be provided directly on the electrode layer, for example, over the dual TIN electrode, using some of these techniques. The electrode layer may include one or more reflective surfaces facing, optionally directly in contact with, the sensing layer, so any photon not absorbed in the sensing layer does not traverse the electrode, but is reflected, so it does not leave the sensing layer and the probability of being converted to a charge carrier is increased.

Finally, a window layer is provided 305 on top of the sensing layer, so the sensing layer is sandwiched between the window layer and the bottom electrode layer. An electrode with high transmittance, for example, a top transparent electrode, may be provided 315 in the window layer, for providing contact to a photodiode in the sensing layer, while at the same time allowing radiation to impinge the sensing layer.

In a further aspect, the disclosed technology provides use of a layer stack comprising a highly reflective material on a thin photon conversion device, for example, a TFPD. For example, the sub-layer closest to the sensing element may have higher reflectivity than the lower sub-layer closer to the readout circuit, for example a reflectivity of 0.7, for example 0.8 or higher, and the lower sub-layer may have better adhesion properties in combination with the underlying layer (either substrate or contact layer). For example, the layer stack may be provided by semiconductor device processing techniques, for example, by deposition. It may be a TiN stack. It may be for example, a bilayer comprising or consisting of TiN provided by ARC and by IMP, where the IMP-provided layer is closest to (and facing) the sensing element. The crystalline structure of each sub-layer may be different, for example the sub-layer closest to the sensing element or sensing layer may have a preferred (2,0,0) orientation, while the sub-layer closest to the circuit may have a preferred (1,1,1) orientation.

The following show the results of the reflectivity of a contact electrode in accordance of embodiments of the disclosed technology.

Figure 7:
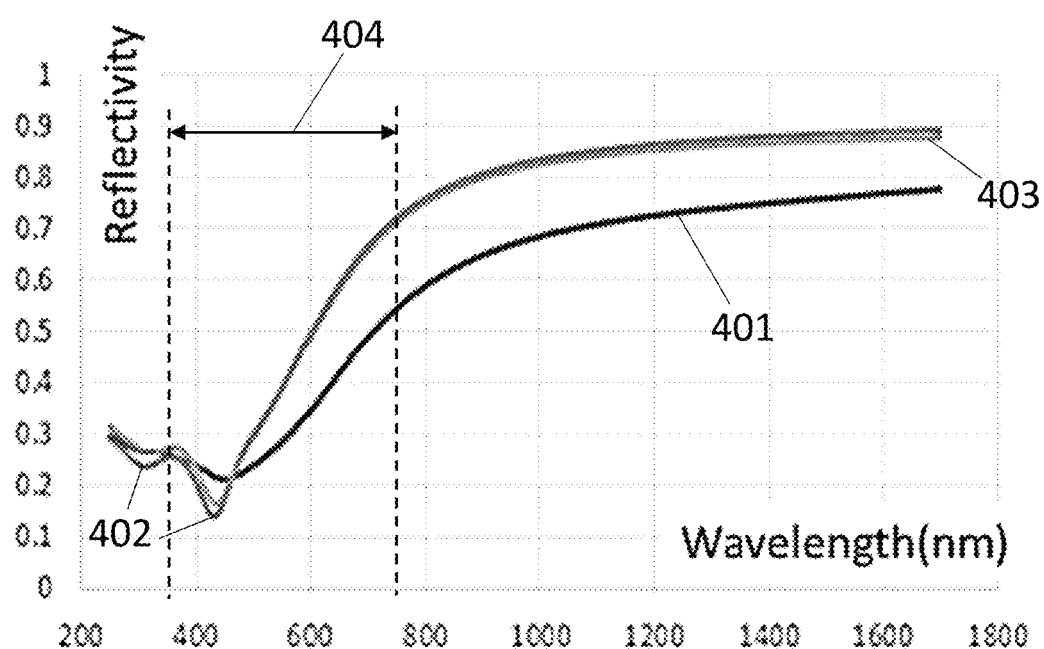
FIG. 7 represents a graph showing the reflectivity of three different TiN electrodes, provided by different deposition techniques (ARC, IMP and a bilayer provided by ARC and then IMP on top) in accordance with embodiments of the disclosed technology.

FIG. 7 shows the relationship between the reflectivity (1 being total reflection) and the wavelength for three TiN layers with the same thickness, the three layers having been produced using different deposition techniques. The reflectivity is measured for a range of wavelengths between middle ultraviolet range and the middle infrared.

The three layers have the same thickness, for example, a thickness of 100 nm. The graph 401 appearing lower at IR ranges (800 nm to 1800 nm) shows the relationship corresponding to the reflectivity of a TiN layer produced by ARC deposition. The graph 402 appearing lower at the violet and UV region (200 nm to 400 nm) shows the relationship corresponding to the reflectivity of a TiN layer produced by IMP deposition. The remaining graph 403 shows the relationship corresponding to the reflectivity of a TiN layer stack, or bi-layer, comprising a first layer, for example with a thickness of 50 nm or higher, up to 400 nm, produced by ARC deposition and a second layer, for example, with a thickness between 20 nm and 100 nm produced by IMP deposition. In most of the visible spectrum range 404 (more specifically, for wavelengths higher than approximately 500 nm) and well into the infrared region, the graphs 402, 403 of the layer produced by IMP deposition and the bi-layer, the reflectivity is practically the same, and superior to the reflectivity of the TiN layer produced by ARC deposition.

It can be seen that, with the same thickness, the bi-layer TiN stack has almost the same reflectivity as the single IMP TiN while the single ARC TiN layer has around 10% lower reflectivity than the first two, especially for wavelength ranges of middle-IR, near-IR and even within the visible range close to IR.

Thus, an optical sensor with a bottom electrode which may have a reflectance of 0.5 for radiation of wavelength of 600 nm can be obtained. For example, the reflectance may be 0.7, for example, 0.7 for red, or higher for near IR, for example, 0.8 for near IR (wavelengths over 800 nm) or even 0.9 for IR (for wavelengths close to 1400 nm).

The provision of an IMP-deposited layer of TiN facing the sensing layer provides reflection of radiation (photons) not absorbed by the sensing layer. Thanks to this reflection, the thickness of the sensing layer is effectively doubled, improving the EQE. The improvement in EQE between ARC and ARC/IMP in actual devices are shown in FIG. 8 and FIG. 9.

Figure 8:
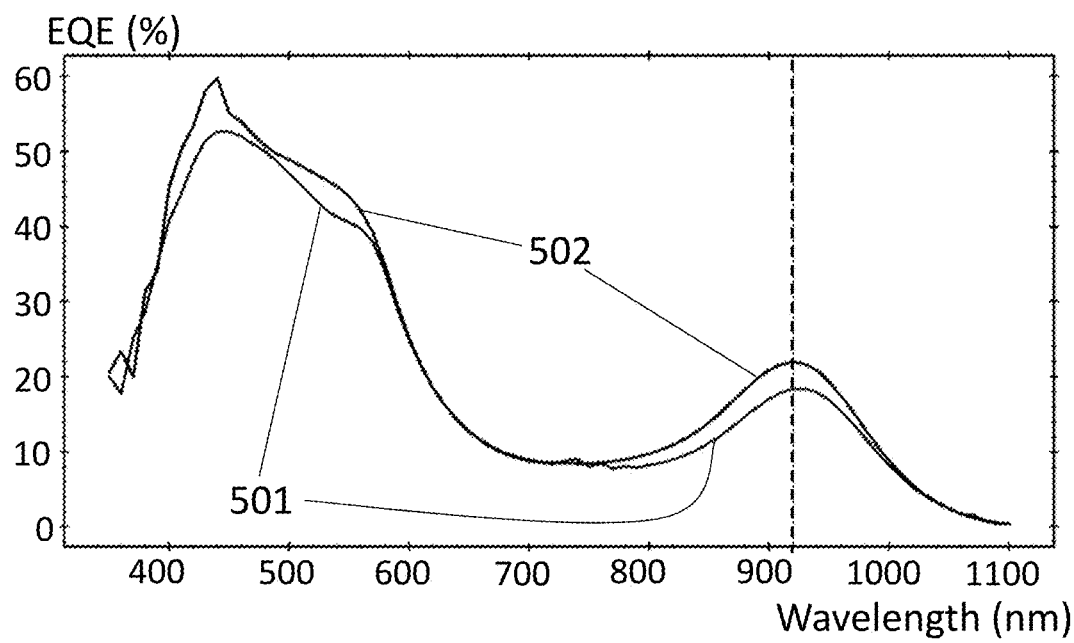
FIG. 8 and FIG. 9 show two graphs illustrating the effectivity of the optical sensor, as a function of the wavelength for a fixed voltage, and as a function of the voltage for a fixed wavelength, respectively, showing the difference of EQE of the sensor with a bottom electrode provided by different techniques.

FIG. 8 shows the EQE at −3V bias voltage in two TFPD devices; the lower graph 501 shows the EQE for a TFPD device with a TiN electrode provided by ARC, while the top graph 502 shows the EQE for a TFPD device with a TiN electrode provided by ARC/IMP. While the EQE is generally the same or higher for the TFPD with an ARC/IMP-deposited TiN bottom electrode, the EQE is noticeable higher in the near −IR region. For example, at a wavelength of 920 nm, the EQE of the TFPD device with a TiN electrode provided by ARC is 18.39%, while the EQE of the TFPD device with a TiN electrode provided by IMP is 21.96%.

Figure 9:
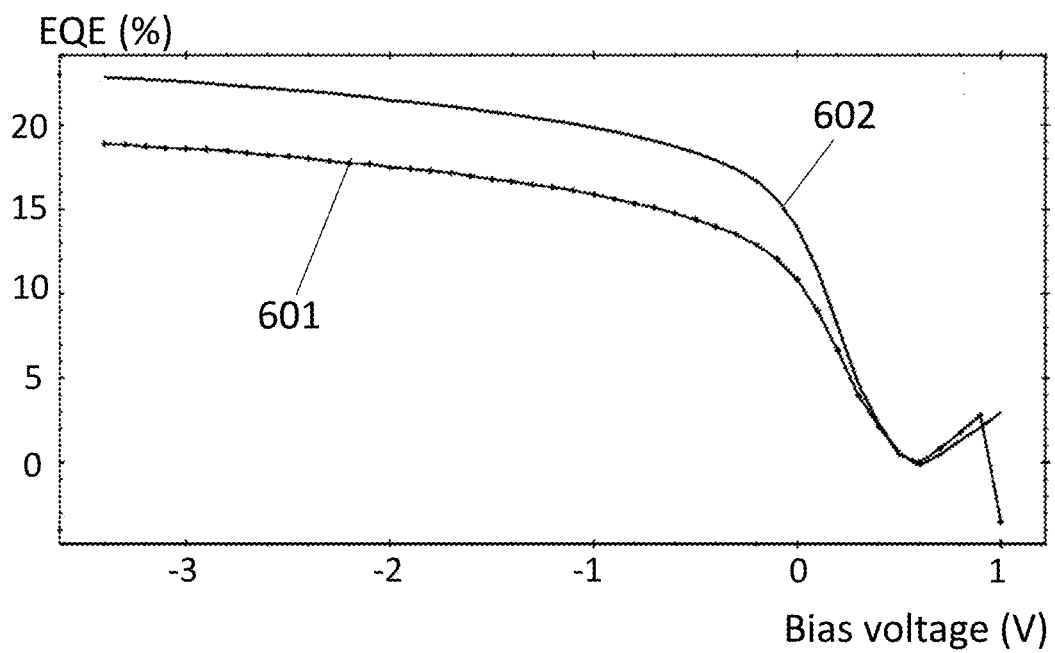

FIG. 9 shows the variation of the EQE at 920 nm illumination in the same two TFPD devices, for different bias voltages. The lower graph 601 shows the EQE for a TFPD device with a TiN electrode provided by ARC, which is consistently lower than the top graph 602 corresponding to the EQE for a TFPD device with a TiN electrode provided by ARC/IMP, for all the range of negative bias. The following tabulated values can be extracted from the graph:

TABLE

| EQE OF TFPDS ILLUMINATED WITH 920 NM RADIATION FOR DIFFERENT BIAS | | | |
|---|---|---|---|
| Bias voltage (V) | −1 V | −2 V | −3 V |
| EQE, electrode formed by ARC/IMP | 19.837 | 21.453 | 22.566 |
| EQE, electrode formed by ARC | 15.876 | 17.497 | 18.597 |

The disclosed technology may provide the advantages of high reflectivity, lower wafer stress compared to single TiN electrode using only IMP TiN, and it is compatible with Cu metallization in the Back-end-of-Line interconnect.

Because of the multilayered bottom electrode, higher thickness can be obtained with lower stress level in the substrate (lower bowing), so the transmittance to the circuitry is lower. The noise current can thus be reduced in the readout circuit.

The signal to noise ratio (SNR) between the photocurrent and the noise current is also improved. With the multilayered implementation (for example, the dual TiN layer) the EQE and thus the photocurrent can be improved, without increasing dark current, leading to improved SNR.

In summary, the disclosed technology presents an optical sensor, manufacture thereof and use of a bottom electrode, which increases EQE by reflecting photons not absorbed in the sensing layer back into the sensing layer, the bottom electrode being compatible with semiconductor processing and with BEOL processing, in particular with the contacts (e.g. Cu contacts) of a readout circuit. For example, the bottom electrode may be a TiN mirror multilayer provided by room temperature deposition (such as cathodic arc deposition) followed by high temperature deposition (such as IMP). This bottom electrode can be used in TFPDs and other similar photon conversion devices, for example in near-infrared and infrared thin film photo-diode imaging applications.

What is claimed is:

1. An optical sensor comprising stacked layers comprising:
   a window layer configured to allow the passage of photons;
   a sensing layer configured to generate charges upon impinging of the photons through the window layer; and
   a bottom electrode layer comprising at least one bottom electrode for receiving charges generated in the sensing layer,
   wherein the sensing layer is sandwiched between the window layer and the bottom electrode layer,
   wherein the at least one bottom electrode of the bottom electrode layer comprises conductive material with reflectivity higher than 0.7 to reflect back received photons into the sensing layer, the at least one bottom electrode being obtained by semiconductor device fabrication techniques, and
   wherein the at least one bottom electrode comprises multiple sub-layers forming a stack, wherein a sub-layer closest to the sensing layer is more reflective than a sub-layer of the bottom electrode away from the sensing layer.

2. The optical sensor of claim 1, wherein the window layer comprises at least one transparent top electrode.

3. The optical sensor of claim 1, wherein the at least one bottom electrode comprises a titanium-based binary (Ti—X) or ternary (Ti—X—Y) metal compound.

4. The optical sensor of claim 1, wherein the at least one bottom electrode comprises titanium nitride.

5. The optical sensor of claim 1, wherein crystallites of the sub-layer closest to the sensing layer have a preferred (2,0,0) orientation while crystallites of the sub-layer away from the sensing layer have a preferred (1,1,1) orientation.

6. The optical sensor of claim 1, wherein the multiple sub-layers comprise a bi-layer including a first cathode arc physical vapor deposition TiN layer and a second ionized metal plasma physical vapor deposition TiN layer, between the first layer and the sensing layer.

7. The optical sensor of claim 6, wherein the first cathode arc physical vapor deposition TiN layer has a thickness less than 200 nm.

8. The optical sensor of claim 7, wherein the first cathode arc physical vapor deposition TiN layer has a thickness between 50 nm and 100 nm.

9. The optical sensor of claim 6, wherein the second ionized metal plasma physical vapor deposition TiN layer has a thickness between 20 nm and 100 nm.

10. The optical sensor of claim 1, further comprising a readout circuit provided on a substrate, electrically connected to the at least one bottom electrode.

11. The optical sensor of claim 10, further comprising a contact layer comprising at least one contact electrically connected to the at least one bottom electrode for providing electrical connection between the at least one bottom electrode and the readout circuit.

12. A thin-film photodiode sensing device comprising an optical sensor in accordance with claim 1.

13. The optical sensor of claim 1, wherein the sensing layer has a thickness between 50 nm and 500 nm.

14. The optical sensor of claim 1, wherein the bottom electrode layer has a thickness between 50 nm and 500 nm.

15. A method of manufacturing an optical sensor, the method comprising:
   providing a sensing layer; and
   providing a bottom electrode layer on a surface of the sensing layer, thus covering at least part of the area of the surface of the sensing layer,
   wherein the bottom electrode layer comprises conductive material with a reflectivity higher than 0.7,
   wherein providing the bottom electrode layer comprises providing the conductive material using semiconductor device manufacturing techniques, and
   wherein providing the bottom electrode layer comprises depositing multiple sub-layers forming a stack, wherein a sub-layer closest to the sensing layer is more reflective than a sub-layer of the bottom electrode layer away from the sensing layer.

16. The method of claim 15, wherein providing the bottom electrode layer comprises providing a titanium-based binary or ternary metal compound as the conductive material.

17. The method of claim 16, wherein providing the bottom electrode layer comprises providing titanium nitride as the conductive material.

18. The method of claim 15, wherein depositing multiple sub-layers comprises depositing a first sub-layer at a temperature under 50° C., and subsequently depositing a second sub-layer on top of the first sub-layer at a temperature over 200° C.

19. The method of claim 18, wherein depositing the first sub-layer and the second sub-layer comprises depositing the first sub-layer such that crystallites of the first sub-layer have a preferred (2,0,0) orientation and depositing the second sub-layer such that crystallites of the second sub-layer have a preferred (1,1,1) orientation.

20. The method of claim 18, wherein depositing multiple sub-layers comprises depositing a bi-layer including a first TiN layer provided by cathode arc physical vapor deposition and a second TiN layer, between the first layer and the sensing layer, provided by ionized metal plasma physical vapor deposition.

21. The method of claim 20, further comprising providing a readout circuit on a substrate and electrically connecting the readout circuit to the bottom electrode layer.

22. The method of claim 21, further comprising providing a contact layer comprising at least one contact and electrically connecting the contact layer to the bottom electrode layer to provide electrical connection between the bottom electrode layer and the readout circuit.

23. The method of claim 22, further comprising providing a window layer configured to allow the passage of photons through the window layer and to the sensing layer.

* * * * *